(12) United States Patent
Chen et al.

(10) Patent No.: US 6,664,190 B2
(45) Date of Patent: Dec. 16, 2003

(54) PRE STI-CMP PLANARIZATION SCHEME

(75) Inventors: Feng Chen, Singapore (SG); Cheng-Hou Loh, Singapore (SG); Paul Proctor, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 201 days.

(21) Appl. No.: 09/951,916

(22) Filed: Sep. 14, 2001

(65) Prior Publication Data

US 2003/0054654 A1 Mar. 20, 2003

(51) Int. Cl.$^7$ .............................................. H01L 21/311
(52) U.S. Cl. ........................................ 438/697; 438/700
(58) Field of Search ................................ 438/424, 427, 438/697, 700, 691, 692, 745, 750

(56) References Cited

U.S. PATENT DOCUMENTS

| | | | |
|---|---|---|---|
| 4,954,459 A | 9/1990 | Avanzino et al. | 437/228 |
| 4,962,064 A | 10/1990 | Haskell et al. | 437/228 |
| 5,173,439 A | 12/1992 | Dash et al. | 437/67 |
| 5,494,857 A * | 2/1996 | Cooperman et al. | 438/437 |
| 5,712,185 A | 1/1998 | Tsai et al. | 437/67 |
| 5,736,462 A | 4/1998 | Takahashi et al. | 438/692 |
| 5,880,607 A | 3/1999 | Mitra | 326/93 |
| 5,923,993 A * | 7/1999 | Sahota | 438/427 |
| 5,961,794 A | 10/1999 | Morita | 204/192.34 |
| 5,998,297 A | 12/1999 | Brennan | 438/687 |
| 6,015,755 A | 1/2000 | Chen et al. | 438/692 |
| 6,015,757 A * | 1/2000 | Tsai et al. | 438/697 |
| 6,103,581 A | 8/2000 | Lin et al. | 438/296 |
| 6,103,594 A * | 8/2000 | See et al. | 438/427 |
| 6,146,974 A | 11/2000 | Liu et al. | 438/435 |
| 6,169,012 B1 * | 1/2001 | Chen et al. | 438/427 |
| 6,197,691 B1 | 3/2001 | Lee | 438/691 |
| 6,303,461 B1 * | 10/2001 | Chen et al. | 438/404 |
| 6,448,159 B1 * | 9/2002 | Chen et al. | 438/500 |

* cited by examiner

*Primary Examiner*—Kin-Chan Chen
(74) *Attorney, Agent, or Firm*—George O. Saile; Rosemary L. S. Pike

(57) ABSTRACT

A new method of forming shallow trench isolations using a reverse mask process is described. A polish stop layer is deposited on the surface of a substrate. An etch stop layer is deposited overlying the polish stop layer. A plurality of isolation trenches is etched through the etch stop layer and the polish stop layer into the substrate whereby narrow active areas and wide active areas of the substrate are left between the isolation trenches. An oxide layer is deposited over the etch stop layer and within the isolation trenches. The oxide layer is covered with a mask in the narrow active areas and in the isolation trenches and etched away in the wide active areas stopping at the etch stop layer. Thereafter, the mask is removed and the etch stop layer is polished away to the polish stop layer whereby the oxide layer in the isolation trenches is planarized.

26 Claims, 5 Drawing Sheets

PRE STI-CMP PLANARIZATION SCHEME

BACKGROUND OF THE INVENTION (1) Field of the Invention

The invention relates to a method of fabricating semiconductor structures, and more particularly, to a method of forming planarized shallow trench isolation structures in the manufacture of integrated circuit devices.

(2) Description of the Prior Art

Shallow trench isolation (STI) is now commonly used in the art as an alternative to local oxidation of silicon (LOCOS) for forming isolations between active device areas in the integrated circuit. STI offers the advantages of smaller isolation area and better surface planarization when compared to LOCOS. However, the STI process suffers from dishing, especially over large trenches. Dishing can cause excessive device leakage in some cases.

Several prior art approaches disclose methods to form and planarize shallow trench isolations. U.S. Pat. No. 6,197,691 to Lee shows a chemical mechanical polishing (CMP) process using silicon nitride as an etch stop layer. U.S. Pat. No. 5,712,185 to Tsai et al and U.S. Pat. No. 5,736,462 to Takahashi et al show processes in which a polysilicon layer over a silicon nitride layer is used as an etch stop for CMP. U.S. Pat. No. 5,173,439 to Dash et al and U.S. Pat. No. 4,962,064 to Haskell et al teach using polysilicon as a mask over wide trenches. U.S. Pat. No. 4,954,459 to Avanzino et al, U.S. Pat. No. 5,961,794 to Morita, and U.S. Pat. No. 6,015,755 to Chen et al teach reverse mask processes. U.S. Pat. No. 6,103,581 to Lin et al discloses a non-crystalline silicon hard mask layer. U.S. Pat. No. 6,146,974 to Liu et al shows STI process.

SUMMARY OF THE INVENTION

A principal object of the present invention is to provide an effective and very manufacturable method of fabricating shallow trench isolations in the manufacture of integrated circuits.

A further object of the present invention is to provide a method to fabricate planarized shallow trench isolations.

Another object of the present invention is to provide a method to fabricate planarized shallow trench isolations using a reverse mask process for chemical mechanical polishing (CMP).

Yet another object of the invention is to provide a method to fabricate planarized shallow trench isolations using polysilicon or amorphous silicon as a reverse mask etch stop for chemical mechanical polishing (CMP).

In accordance with the objects of this invention, a new method of forming shallow trench isolations using a reverse mask process is achieved. A polish stop layer is deposited on the surface of a substrate. An etch stop layer is deposited overlying the polish stop layer. A plurality of isolation trenches is etched through the etch stop layer and the polish stop layer into the substrate whereby narrow active areas and wide active areas of the substrate are left between the isolation trenches. An oxide layer is deposited over the etch stop layer and within the isolation trenches. The oxide layer is covered with a mask in the narrow active areas and in the isolation trenches and etched away in the wide active areas stopping at the etch stop layer. Thereafter, the mask is removed and the etch stop layer is polished away to the polish stop layer whereby the oxide layer in the isolation trenches is planarized to complete planarized shallow trench isolation regions in the manufacture of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
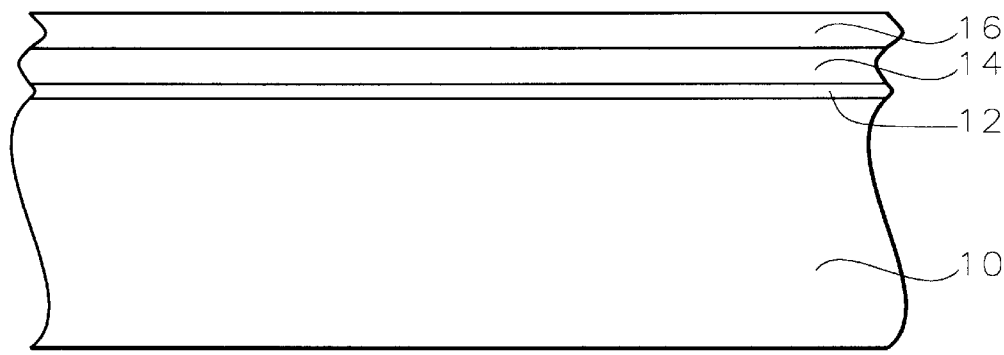
FIGS. 1 through 9 schematically illustrate in cross-sectional representation a preferred embodiment of the present invention.

Referring now more particularly to FIG. 1, there is shown a cross section of a partially completed integrated circuit device. A semiconductor substrate 10, typically consisting of monocrystalline silicon, is provided. A pad silicon dioxide layer 12 is thermally grown over the substrate surface to a thickness of between about 50 and 200 Angstroms. A polish stop layer 14 is deposited overlying the semiconductor substrate 10. The polish stop layer 14 acts as a stop for the subsequent polishing of the gap fill layer. The polish stop layer 14 is preferably comprised of silicon nitride and is deposited by low-pressure chemical vapor deposition (LPCVD). The polish stop layer 14 is deposited to a thickness of between about 1000 and 3000 Angstroms.

In a key feature of the present invention, a polysilicon or amorphous silicon layer 16 is deposited over the polish stop layer as a reverse mask etch stop layer. The layer 16 is preferably deposited by low pressure chemical vapor deposition (LPCVD) to a thickness of between about 1000 and 3000 Angstroms.

Figure 2:
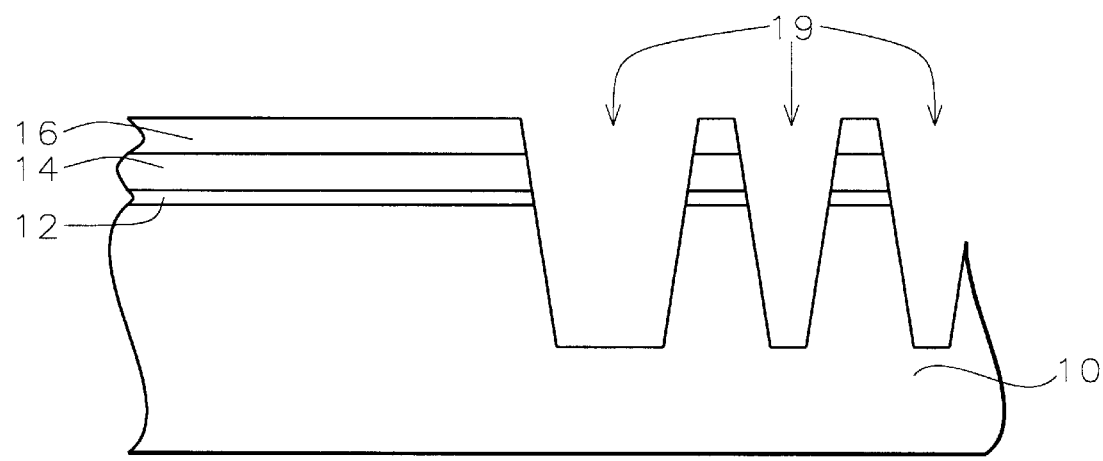
Figure 3:
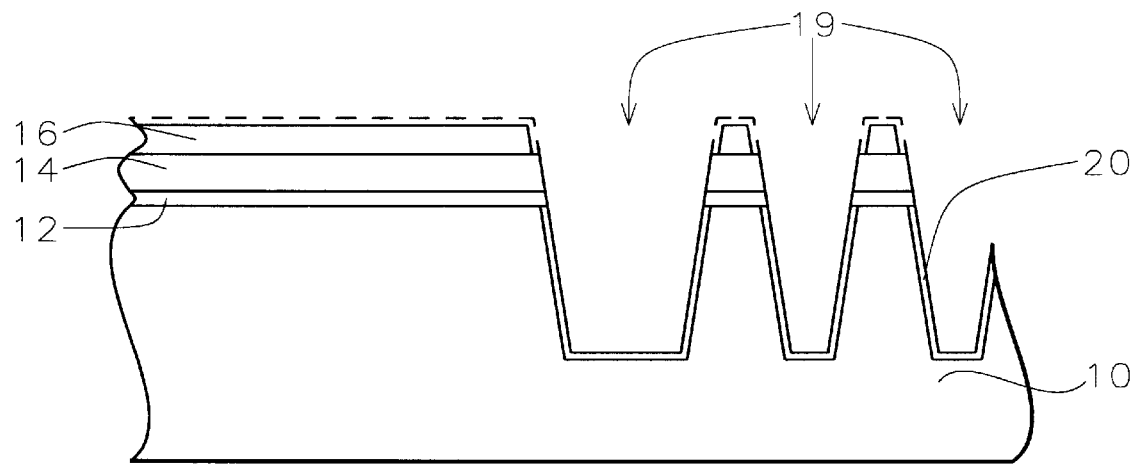

Referring now to FIG. 2, the reverse mask etch stop layer 16, the polish stop layer 14, and the semiconductor substrate 10 are etched to form trenches 19 for planned shallow trench isolations. The trenches are etched using a conventional etching process such as reactive ion etching (RIE) to a depth of between about 3000 and 4000 Angstroms. A liner oxide layer 20 is grown within the trenches 19 to a thickness of between about 50 and 200 Angstroms. This thermal oxidation also oxidizes the polysilicon layer 16, as shown by the dashed lines in FIG. 3.

Figure 4:
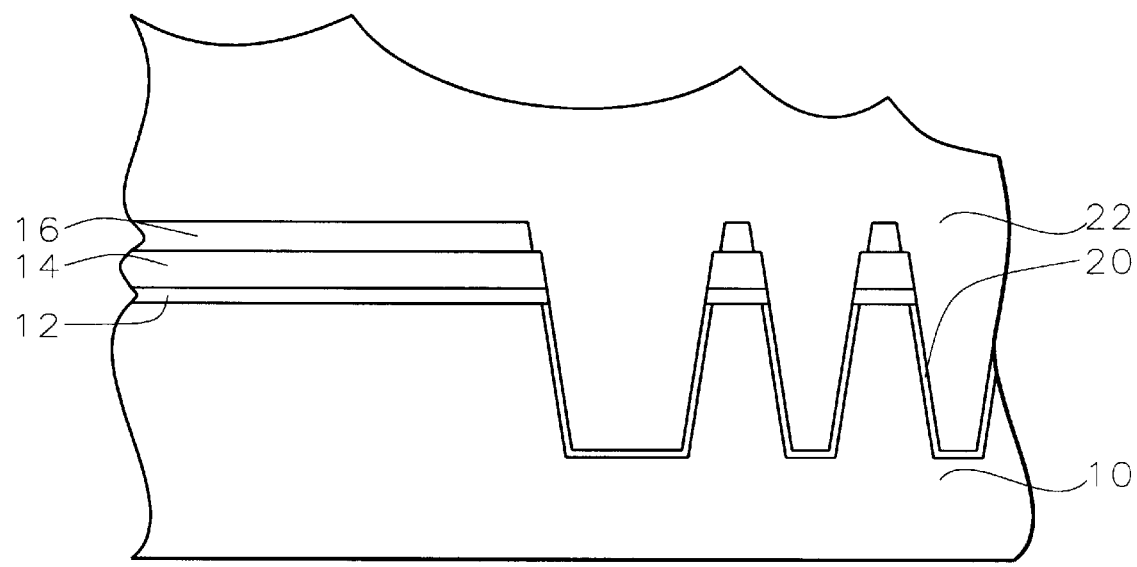

Referring now to FIG. 4, a gap fill layer 22 of high density plasma (HDP) oxide is deposited overlying the polysilicon layer 16 and filling the trenches. HDP oxide is used because of the excellent gap filling properties of this process. In an HDP plasma process, the silicon dioxide material is deposited and etched simultaneously in the same reaction. This process causes the silicon dioxide to be deposited very densely and with no voids. In addition, the etching process causes the HDP oxide to assume the near 45 degree angle profile at trench corners as shown in the illustration. In addition, a densification step is performed. The HDP oxide layer 22 is deposited to a thickness of between about 6000 and 8000 Angstroms.

Figure 5:
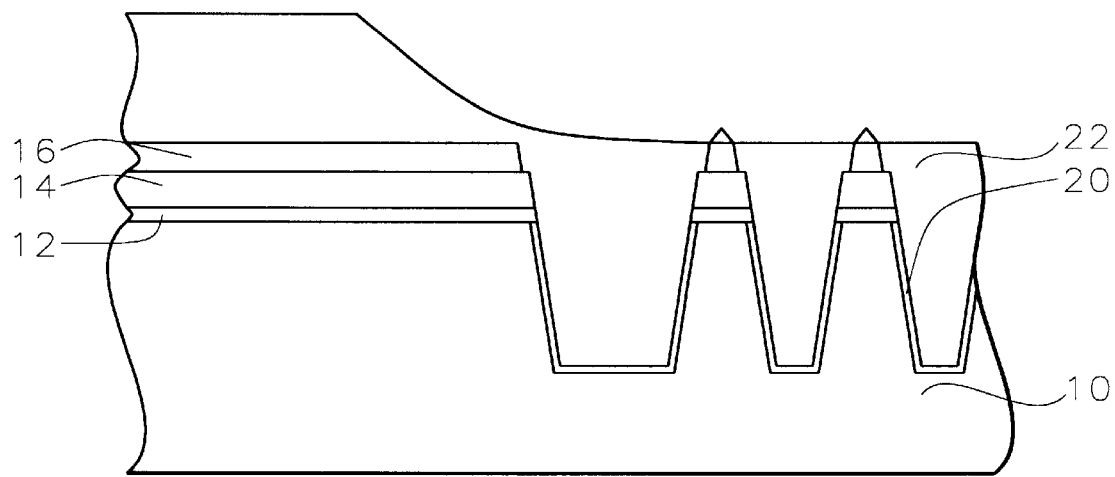

Referring now to FIG. 5, a wet dip, such as hydrofluoric acid (HF), is performed to remove about 1000 to 3000 Angstroms of the HDP oxide 22. The oxide dip stops at the polysilicon layer 16, using time control or end point control.

Figure 6:
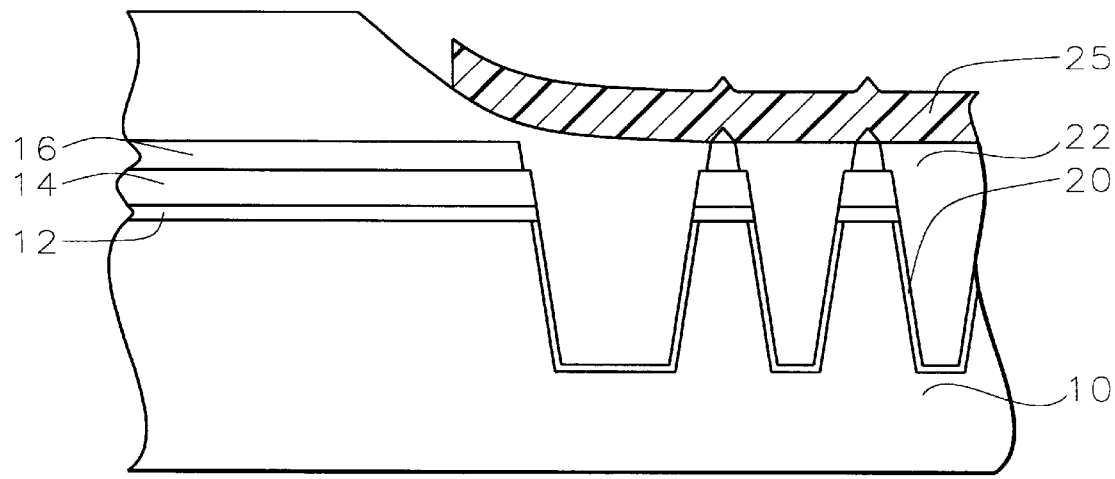

Now, as shown in FIG. 6, a photoresist mask 25 is formed over the substrate by a reverse mask process. The mask covers the trench areas and narrow active areas and exposes the wide active areas. The HF dip step has greatly reduced the pre-CMP thickness variation between the reverse mask open and non-open areas.

Now, the oxide layer 22 is etched away over the large active areas where it is not covered by the mask 25, using the polysilicon layer 16 as the etch stop. If the silicon nitride layer 14 were used as the etch stop layer, the silicon nitride layer would be gouged into by the etching process causing pre-CMP silicon nitride thickness variation from the reverse mask open area in the large active areas to the reverse mask covered areas.

Figure 7:
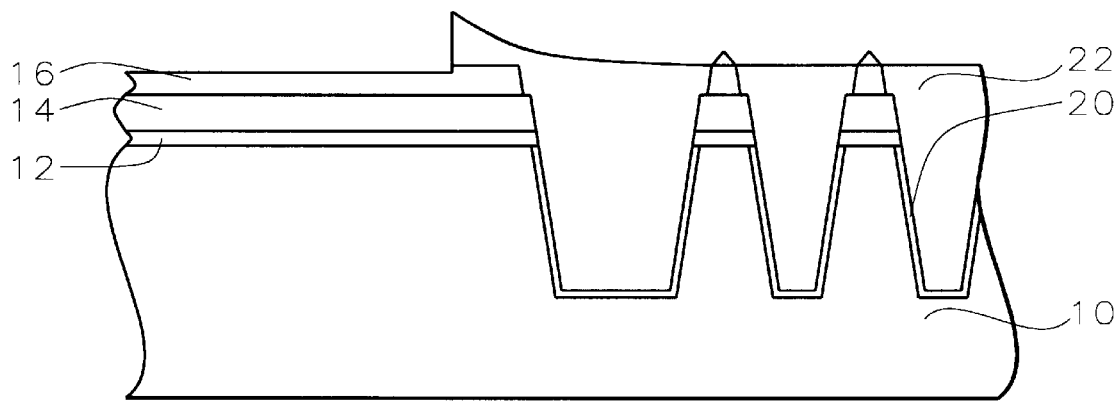

However, in the process of the present invention, the polysilicon or amorphous silicon layer 16 acts as the reverse mask etch stop layer, so silicon nitride thickness uniformity is maintained. FIG. 7 illustrates the integrated circuit device after etching and photoresist stripping. A more planarized topography before CMP is realized with the polysilicon reverse mask etch stop layer than with a silicon nitride etch stop layer.

Figure 8:
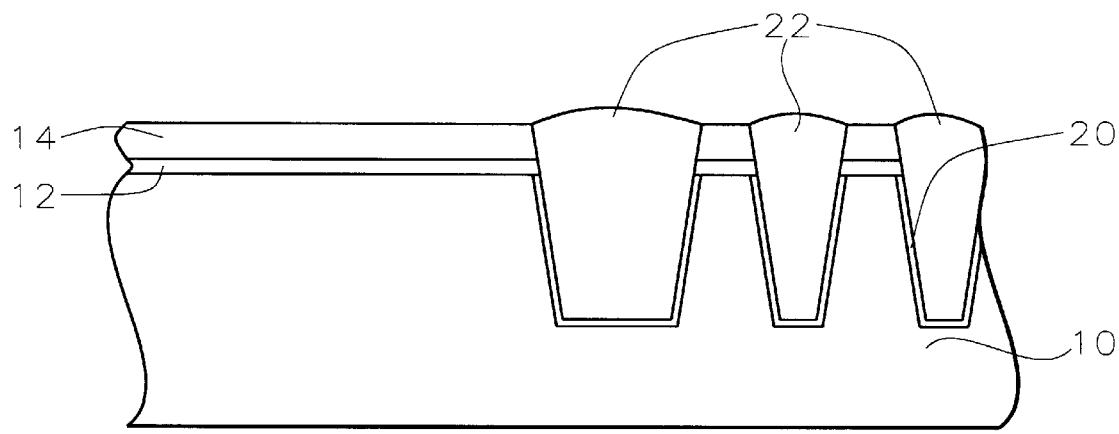

Now, chemical mechanical polishing (CMP) is performed to complete planarization of the STI oxide. FIG. 8 shows the CMP process in progress. Trench oxide humping occurs while the polysilicon layer 16 is being polished since the polish rate selectivity of polysilicon to oxide is about 25:1 with a silicon dioxide-based slurry.

Figure 9:
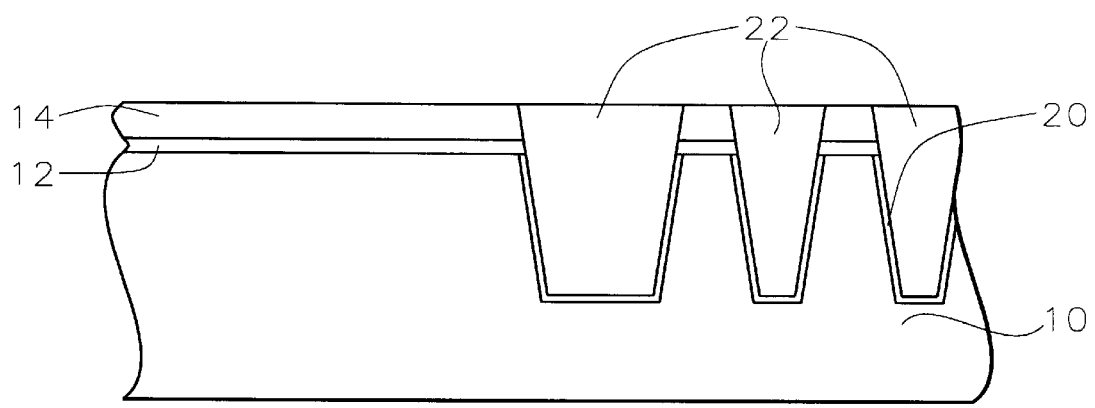

FIG. 9 illustrates the device after CMP is completed. The humping shown in FIG. 8 compensates for the dishing that occurs when the silicon nitride layer is etched, thus resulting in good planarization without dishing.

This completes fabrication of the shallow trench isolation regions. The shallow trench isolation has been formed without dishing. The reverse mask etch stop layer allows a more planar topography before CMP. During CMP, the reverse mask etch stop layer acts as a buffing layer, forming trench oxide humping which compensates for the dishing effect. The final result is planarized shallow trench isolation.

While the invention has been particularly shown and described with reference to the preferred embodiments thereof, it will be understood by those skilled in the art that various changes in form and details may be made without departing from the spirit and scope of the invention.

What is claimed is:

1. A method of forming shallow trench isolation regions in the manufacture of an integrated circuit device comprising:

depositing a polish stop layer on the surface of a substrate;

depositing an etch stop layer overlying said polish stop layer;

etching a plurality of isolation trenches through said etch stop layer and said polish stop layer into said substrate whereby narrow active areas and wide active areas of said substrate are left between said isolation trenches;

depositing an oxide layer over said etch stop layer and within said isolation trenches;

thereafter covering said oxide layer with a mask in said narrow active areas and in said isolation trenches and etching away said oxide layer in said wide active areas stopping at said etch stop layer; and thereafter removing said mask and polishing away said etch stop layer to said polish stop layer whereby said oxide layer in said isolation trenches is planarized to complete planarized said shallow trench isolation regions in said manufacture of said integrated circuit device.

2. The method according to claim 1 further comprising growing a pad oxide layer on said substrate before said step of depositing said polish stop layer.

3. The method according to claim 1 wherein said polish stop layer comprises silicon nitride deposited by chemical vapor deposition to a thickness of between about 1000 and 3000 Angstroms.

4. The method according to claim 1 wherein said etch stop layer is selected from the group consisting of polysilicon and amorphous silicon and is deposited by low pressure chemical vapor deposition to a thickness of between about 1000 and 3000 Angstroms.

5. The method according to claim 1 further comprising growing a liner layer within said isolation trenches before said step of depositing said oxide layer within said isolation trenches whereby an outside portion of said etch stop layer is also oxidized.

6. The method according to claim 1 further comprising removing an upper portion of said oxide layer using a wet dip prior to said step of covering said oxide layer with a mask.

7. The method according to claim 1 wherein said step of covering said oxide layer with a mask comprises forming a photoresist mask using a reverse mask process.

8. The method according to claim 1 wherein said step of polishing away said etch stop layer to said polish stop layer comprises chemical mechanical polishing.

9. The method according to claim 1 wherein humping of said oxide over said isolation trenches occurs during said polishing away of said etch stop layer and wherein said humping compensates for dishing which occurs during said polishing after said etch stop layer is removed thereby resulting in good shallow trench isolation planarization without dishing.

10. The method according to claim 1 further comprising fabricating semiconductor device structures in and on said substrate between said isolation trenches.

11. A method of forming shallow trench isolation regions in the manufacture of an integrated circuit device comprising:

depositing a polish stop layer on the surface of a substrate;

depositing an etch stop layer overlying said polish stop layer;

etching a plurality of isolation trenches through said etch stop layer and said polish stop layer into said substrate whereby narrow active areas and wide active areas of said substrate are left between said isolation trenches;

depositing by a high density plasma process an oxide layer over said etch stop layer and within said isolation trenches;

thereafter covering said oxide layer with a mask in said narrow active areas and in said isolation trenches and etching away said oxide layer in said wide active areas stopping at said etch stop layer; and thereafter removing said mask and polishing away said etch stop layer to said polish stop layer whereby said oxide layer in said isolation trenches is planarized to complete planarized said shallow trench isolation regions in said manufacture of said integrated circuit device.

12. The method according to claim 11 further comprising growing a pad oxide layer on said substrate before said step of depositing said polish stop layer.

13. The method according to claim 11 wherein said polish stop layer comprises silicon nitride deposited by chemical vapor deposition to a thickness of between about 1000 and 3000 Angstroms.

14. The method according to claim 11 wherein said etch stop layer is selected from the group consisting of polysilicon and amorphous silicon and is deposited by low pressure chemical vapor deposition to a thickness of between about 1000 and 3000 Angstroms.

15. The method according to claim 11 further comprising growing a liner layer within said isolation trenches before said step of depositing said oxide layer within said isolation trenches whereby an outside portion of said etch stop layer is also oxidized.

16. The method according to claim 11 further comprising removing an upper portion of said oxide layer using a wet dip prior to said step of covering said oxide layer with a mask.

17. The method according to claim 11 wherein said step of covering said oxide layer with a mask comprises forming a photoresist mask using a reverse mask process.

18. The method according to claim 11 wherein said step of polishing away said etch stop layer to said polish stop layer comprises chemical mechanical polishing.

19. The method according to claim 11 wherein humping of said oxide over said isolation trenches occurs during said polishing away of said etch stop layer and wherein said humping compensates for dishing which occurs during said polishing after said etch stop layer is removed thereby resulting in good shallow trench isolation planarization without dishing.

20. The method according to claim 11 further comprising fabricating semiconductor device structures in and on said substrate between said isolation trenches.

21. A method of forming shallow trench isolation regions in the manufacture of an integrated circuit device comprising:

depositing a pad oxide layer on the surface of a substrate;

depositing a polish stop layer overlying said pad oxide layer;

depositing an etch stop layer overlying said polish stop layer wherein said etch stop layer is selected from the group consisting of polysilicon and amorphous silicon;

etching a plurality of isolation trenches through said etch stop layer and said polish stop layer into said substrate whereby narrow active areas and wide active areas of said substrate are left between said isolation trenches;

growing a liner layer within said isolation trenches whereby an outside portion of said etch stop layer is also oxidized;

depositing by a high density plasma process an oxide layer over said etch stop layer and over said liner layer within said isolation trenches;

removing an upper portion of said oxide layer using a wet dip;

thereafter covering said oxide layer with a mask in said narrow active areas and in said isolation trenches and etching away said oxide layer in said wide active areas stopping at said etch stop layer wherein said mask is a photoresist mask formed using a reverse mask process; and thereafter removing said mask and polishing away said etch stop layer to said polish stop layer whereby said oxide layer in said isolation trenches is planarized to complete planarized said shallow trench isolation regions in said manufacture of said integrated circuit device.

22. The method according to claim 21 wherein said polish stop layer comprises silicon nitride deposited by chemical vapor deposition to a thickness of between about 1000 and 3000 Angstroms.

23. The method according to claim 21 wherein said etch stop layer is deposited by low pressure chemical vapor deposition to a thickness of between about 1000 and 3000 Angstroms.

24. The method according to claim 21 wherein said step of polishing away said etch stop layer to said polish stop layer comprises chemical mechanical polishing.

25. The method according to claim 21 wherein humping of said oxide over said isolation trenches occurs during said polishing away of said etch stop layer and wherein said humping compensates for dishing which occurs during said polishing after said etch stop layer is removed thereby resulting in good shallow trench isolation planarization without dishing.

26. The method according to claim 21 further comprising fabricating semiconductor device structures in and on said substrate between said isolation trenches.

* * * * *